(12) United States Patent
Nelson et al.

(10) Patent No.: US 6,960,529 B1
(45) Date of Patent: Nov. 1, 2005

(54) METHODS FOR SIDEWALL PROTECTION OF METAL INTERCONNECT FOR UNLANDED VIAS USING PHYSICAL VAPOR DEPOSITION

(75) Inventors: Mark M. Nelson, Pocatello, ID (US); Brett N. Williams, Blackfoot, ID (US); Jagdish Prasad, Eagle, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 193 days.

(21) Appl. No.: 10/373,911

(22) Filed: Feb. 24, 2003

(51) Int. Cl.[7] .......................................... H01L 21/311
(52) U.S. Cl. .................. 438/696; 438/622; 438/625; 438/627; 438/636; 438/637; 438/648; 438/687; 438/700; 438/702; 438/720; 438/723; 438/724; 438/742; 438/743; 438/744; 438/754; 438/756; 438/757
(58) Field of Search ........................... 438/622, 625, 438/627, 634, 636, 637, 639, 648, 687, 700, 438/702, 696, 720, 723, 724, 742, 743, 744, 438/754, 756, 757

(56) References Cited

U.S. PATENT DOCUMENTS

| | | | |
|---|---|---|---|
| 5,702,981 A | * | 12/1997 | Maniar et al. ............. 438/627 |
| 5,756,396 A | * | 5/1998 | Lee et al. .................. 438/622 |
| 5,982,035 A | * | 11/1999 | Tran et al. ................. 257/750 |
| 6,097,090 A | * | 8/2000 | Tran et al. ................. 257/750 |
| 6,246,120 B1 | | 6/2001 | Brennan et al. ........... 257/774 |
| 6,333,260 B1 | * | 12/2001 | Kwon et al. ............... 438/643 |

OTHER PUBLICATIONS

Wolf et al., Silicon Processing for the VLSI Era, 1986, vol. 1, Lattice Prress, p. 335.*

* cited by examiner

Primary Examiner—Nadine G. Norton
Assistant Examiner—Eric B. Chen
(74) Attorney, Agent, or Firm—Workman Nydegger (57) ABSTRACT

Methods for protecting the sidewall of a metal interconnect component using Physical Vapor Deposition (PVD) processes and using a single barrier metal material. After forming the metal interconnect component, a single barrier metal is deposited on its sidewall using PVD. A subsequent anisotropic etching of the barrier metal removes the barrier metal from the horizontal surface except for some that still remains on the top surface of the metal interconnect layer. A dielectric layer is then formed over the metal interconnect component and the barrier metal. The unlanded via is etched through the dielectric layer to the metal interconnect component, and then filled with a second metal to thereby allow the metal interconnect component to electrically connect with one or more upper metal layers.

15 Claims, 5 Drawing Sheets

METHODS FOR SIDEWALL PROTECTION OF METAL INTERCONNECT FOR UNLANDED VIAS USING PHYSICAL VAPOR DEPOSITION

BACKGROUND OF THE INVENTION

1. The Field of the Invention

The present invention relates to semiconductor device fabrication technology, and more specifically, to methods for protecting the sidewall of a metal interconnect during a subsequent plug fill of an unlanded via.

2. Background and Related Art

Computing technology has revolutionized the way people work and play and has contributed enormously to the advancement of humankind. Much of computing technology has been enabled by the discovery and advancement of semiconductor processing technology.

Semiconductor processing technology allows for the formation of highly integrated circuits with multiple metal layers. By constructing integrated circuits with multiple metal layers, a given circuit with given feature dimension sizes may be fabricated using much less space than it would if it was permitted just a single metal layer. Furthermore, multiple metal layers enables for much more efficient design and operation of the circuit.

In order for the metal interconnect components in different layers to have sufficient isolation and selective connection with each other, a dielectric layer such as silicon dioxide is formed between the metal layers during the fabrication process. A via is formed by etching the dielectric layer so that a portion of the lower metal interconnect component is exposed. The via is then filled with conductive material such as tungsten. The material structure that fills the via is often termed a "plug". The upper metal interconnect component may then be formed to contact the via plug so that an electrical connection is made between the upper and lower metal interconnect components.

Figure 8A:
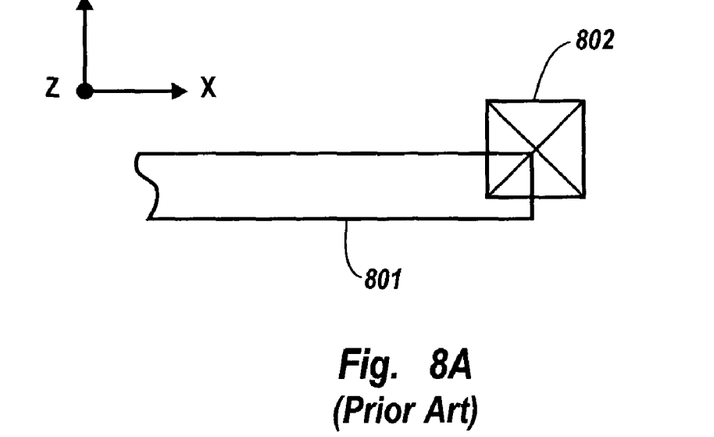
FIG. 8A illustrates a top view of an unlanded via in accordance with the prior art.
Figure 8B:
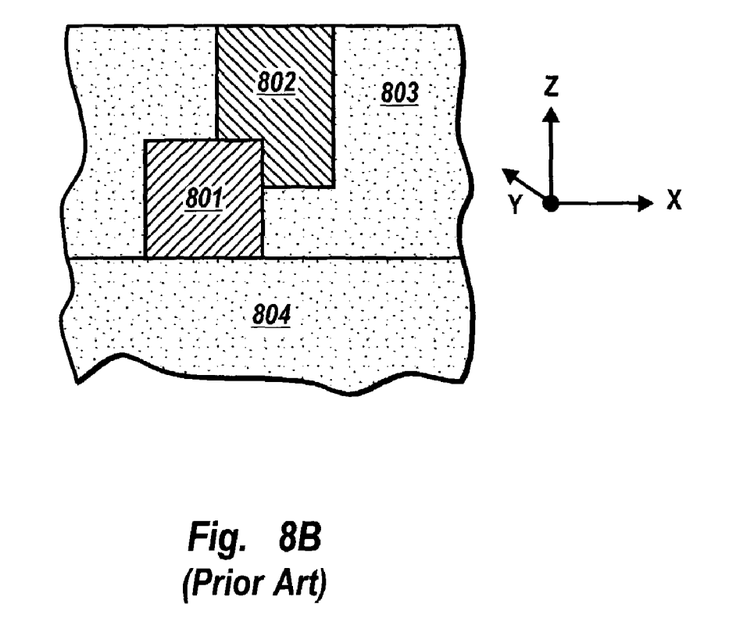
FIG. 8B illustrates a cross-section view of an unlanded via in accordance with the prior art.

The vias are typically designed so that they are directly over the lower metal interconnect component with no overlap. Unfortunately, however, feature dimension sizes are so small that even state of the art alignment technology often results in some misalignment. For example, FIG. 8A illustrates a top view of a plug 802 and a lower metal interconnect component 801. Note how the plug 802 (identified by the box filled with the large X) overlaps the edge of the lower metal interconnect component 801. This type of overlapping misaligned via is often termed an "unlanded via". The result of this misalignment may be apparent from FIG. 8B, which is a cross-sectional view of the plug 802 and lower metal interconnect component 801. FIG. 8B also shows the dielectric material 804 upon which the metal interconnect component 801 is constructed, as well as the dielectric material 803 which supports upper metal interconnect layers (not shown). Before the plug 802 is formed with an appropriate conductive material such as tungsten, the right sidewall of the lower metal interconnect component 801 (which may be, for example, Aluminum) is exposed.

In order to deposit the tungsten material, the device is exposed to a Tungsten Hexafluoride ($WF_6$) gas under certain conventionally-known environmental conditions. The Tungsten forms within the via, while the Fluorine (F) atoms continue in gaseous form. Some of those Fluorine atoms may react with the Aluminum (Al) to generate Aluminum Tetrafluoride ($AlF_4$), which will conduct for a short time, and then form an electrical discontinuity, thereby frustrating the operation of the circuit.

In order to protect against the harmful reaction between the Aluminum metal interconnect component and the Fluorine gas, a Titanium Nitride layer is often deposited on top of the Aluminum metal interconnect component prior to forming the dielectric layer and the via over the metal interconnect component. This serves the dual purpose of an antireflective coating to improve photolithographic precision during patterning of the metal interconnect component, as well as buffering the top of the metal interconnect component from harmful reactions with the Fluorine gas. In the case of an unlanded via, however, the sidewalls would remain exposed during the tungsten deposition in the via absent further measures.

There have been several conventional measures engaged in to protect the sidewalls of metal interconnect components from harmful reactions during the formation of via material. Many involve the formation of a barrier metal on the side walls using Chemical Vapor Deposition (CVD) process. CVD processes tend to be quite expensive to implement since CVD apparatus are quite expensive and occupy significant and precious real estate in a fabrication plant.

Other conventional techniques involve forming several barrier layers or different materials on the sidewalls. This works, but includes a number of fabrication steps thereby increasing the cost of fabrication and introducing new factors for yield reduction. Accordingly, what would be advantageous are methods for protecting the sidewall of a metal interconnect component for unlanded vias without requiring Chemical Vapor Deposition (CVD) processes or multiple barrier metals for protecting the sidewall.

BRIEF SUMMARY OF THE INVENTION

The foregoing problems with the prior state of the art are overcome by the principles of the present invention, which are directed towards methods for protecting the sidewall of a metal interconnect component using Physical Vapor Deposition (PVD) processes and using a single barrier metal material, thereby allowing for less expensive sidewall protection.

The metal interconnect component is formed of a first metal such as, for example, Aluminum. In one example, the metal interconnect component has a lower Titanium Nitride (TiN) barrier below the metal, as well as an upper Titanium Nitride barrier above the metal. Once the metal interconnect component is formed, a single barrier metal is deposited on at least a portion of a sidewall of the metal interconnect component using a Physical Vapor Deposition (PVD) process such as sputtering. Physical Vapor Deposition typically results in a less uniform deposition, particularly on the side walls. However, since the deposition occurs even before the dielectric layer is formed over the metal interconnect component, good coverage of the barrier metal occurs for those areas of the sidewall that are most likely to be exposed due to an unlanded via. A subsequent anisotropic etching of the barrier metal removes the barrier metal from the horizontal surface except for some that still remains on the top surface of the metal interconnect layer.

A dielectric layer is then formed over the metal interconnect component and the barrier metal. The unlanded via is etched through the dielectric layer to the metal interconnect component so that the barrier metal that covers at least a portion of the sidewall of the metal interconnect component is exposed. The unlanded nature of the via is not necessarily (and is probably not) by design, but is expected to occur due to alignment difficulties. At least some, if not all, of the exposed sidewall is protected by the barrier metal. Accordingly, the via does not substantially expose the aluminum itself.

In order to improve adhesion of the metal that fills the via to the Silicon Dioxide, Titanium Nitride is conventionally deposited on the side walls of the unlanded via using, for example, CVD or PVD processes. The unlanded via is then filled with a second metal such as Tungsten to thereby allow the metal interconnect component to electrically connect with one or more upper metal layers. Since the aluminum is substantially protected both on the top and on all or most of the exposed sidewall, the aluminum does not react (at least not to any significant extent) with the Tungsten Hexafluoride ($WF_6$) carrier gas. This is true even if the unlanded via sidewalls have incomplete coverage of Titanium Nitride as when the sidewalls were deposited using PVD processes. The sidewall of the Aluminum metal interconnect component itself remains more completely protected due to the separate Titanium Nitride deposition that occurred before the formation of the dielectric layer over the metal interconnect component. Accordingly, the bond between the plug that fills the via and the metal interconnect component is more reliable despite there being no Chemical Vapor Deposition (CVD) processes involved with implementing the sidewall protection, and despite there being only one barrier metal protecting the sidewall. Accordingly, the cost associated with protecting the sidewall is reduced.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention involve methods for protecting the sidewall of a metal interconnect component using Physical Vapor Deposition (PVD) processes and using a single barrier metal material, thereby allowing for less expensive sidewall protection. After forming the metal interconnect component, a single barrier metal is deposited on at least a portion of a sidewall of the metal interconnect component using a Physical Vapor Deposition (PVD) process such as sputtering. A subsequent anisotropic etching of the barrier metal removes the barrier metal from the horizontal surface except for some that still remains on the top surface of the metal interconnect layer. The barrier metal deposited through PVD on vertical surfaces substantially remains. A dielectric layer is then formed over the metal interconnect component and the barrier metal. The unlanded via is etched through the dielectric layer to the metal interconnect component so that the barrier metal that covers at least a portion of the sidewall of the metal interconnect component is exposed. The unlanded via is then filled with a second metal to thereby allow the metal interconnect component to electrically connect with one or more upper metal layers.

When fabricating a multiple-layered semiconductor interconnect device, there is a need to electrically connect different metal layers. This is accomplished by forming a via in the dielectric layer that is to separate the metal layers, and then filling the via with conductive material. Often, due to alignment error, a via may overlap the underlying metal interconnect component such that at least portions of the sidewall of the underlying metal interconnect component is exposed after the via etch. Exposure of the metal interconnect to the metal deposition carrier gases needed to form the via plug often results in degraded performance and shorter operating life of the circuit as a whole. While the top of the metal interconnect component is typically protected with an anti-reflective coating deposited in order to aid in patterning the metal interconnect component, the sidewalls often remain exposed to the carrier gases.

Several conventional methods exist for protecting the sidewall from the carrier gases. A barrier metal is sometimes formed on the exposed sidewall after via etch using Chemical Vapor Deposition (CVD) processes. CVD processes are fairly expensive but considered necessary in order to form a thin layer of barrier metal of the sidewall within the confined space of an etched via. Other conventional methods exist in which multiple barrier metals are used which increases the number of process steps involved with protecting the sidewall.

Figure 1:
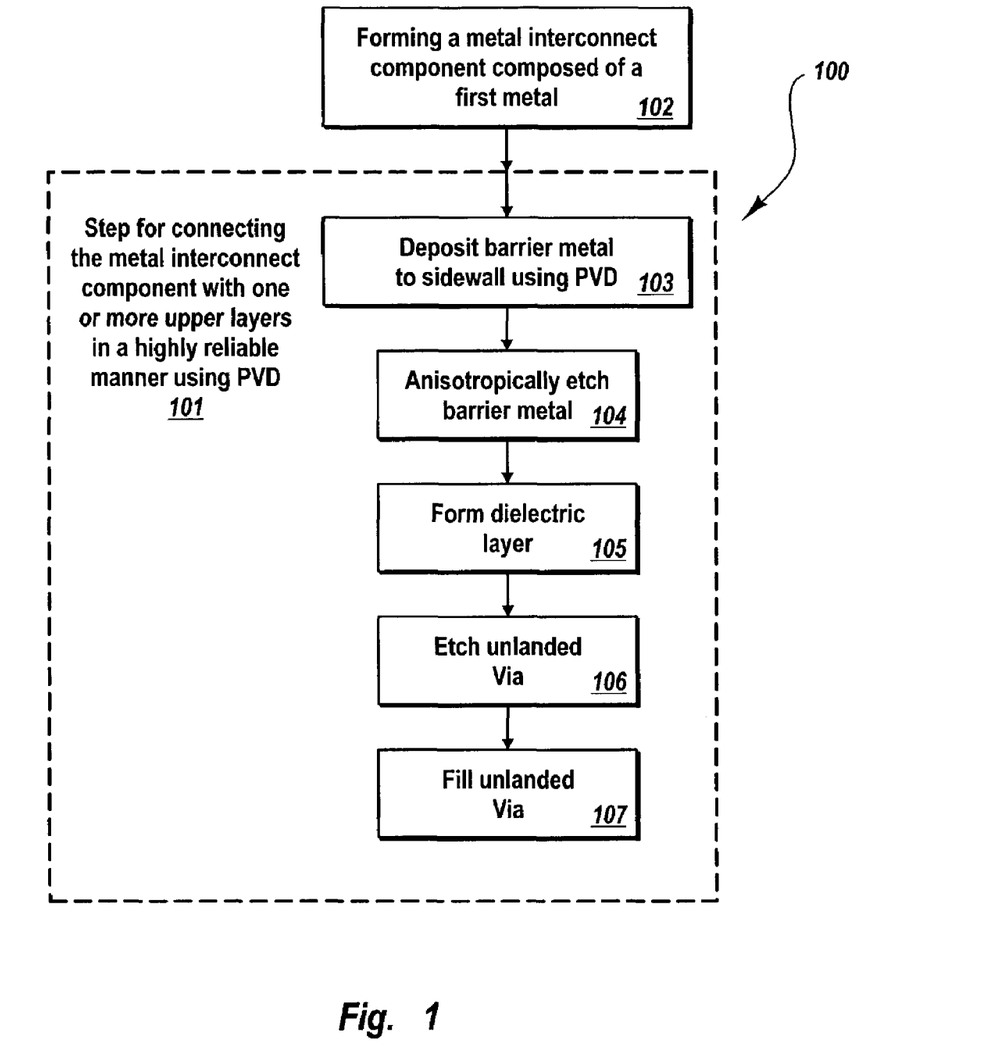
FIG. 1 illustrates a flowchart of a method for protecting a sidewall of a metal interconnect component using Physical Vapor Deposition, and using a single barrier metal on the sidewall in accordance with the principles of the present invention.

FIG. 1 illustrates a flowchart of a method 100 for protecting a sidewall of a metal interconnect component using Physical Vapor Deposition, and using a single barrier metal on the sidewall in accordance with the principles of the present invention. The method includes an act of forming a metal interconnect component composed of a first metal (act 102). The first metal may be any metal that is suitable for use as conductors in an integrated circuit including for example, Aluminum and Copper. As Aluminum is currently the material of choice for the bulk of the conductive metal in an integrated circuit, the remainder of this description will describe Aluminum as the first metal by way of example. However, the principles of the present invention are not limited to the first metal being any particular metal as many metals will suffer from similar corrosion and performance degradation if directly exposed to carrier gasses used to fill the via.

Figure 2:
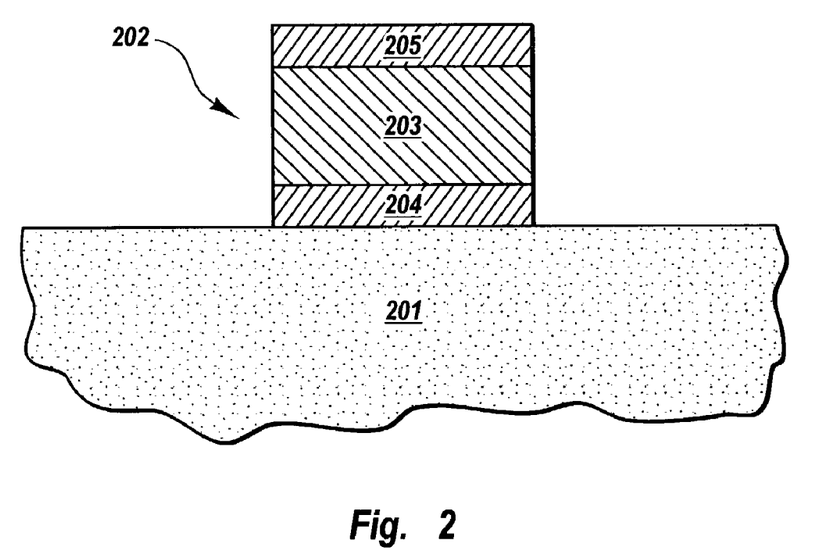
FIG. 2 illustrates a cross-section of a multiple-layered interconnect device after the metal interconnect component has been formed.

FIG. 2 illustrates a cross-section of a multiple-layered interconnect device after the metal interconnect component has been formed (after act 102). The metal interconnect component may be formed using conventional means. For example, one common method for forming a metal interconnect component is to first form a Titanium Nitride bottom layer for better adhesion to a dielectric substrate 201. For example, the dielectric substrate may be a semiconductor wafer, or perhaps the dielectric layer separating the metal interconnect component from lower metal layers. An Aluminum layer and a Titanium Nitride anti-reflective coating are then deposited in that order on the Titanium Nitride bottom layer. The Titanium Nitride layers and the Aluminum layers are then patterned. Elements 203, 204 and 205 in FIG. 2 represent the patterned form of the aluminum layer, the Titanium Nitride bottom layer, and the Titanium Nitride anti-reflective coating.

The method then includes a functional, result-oriented step for connecting the metal interconnect component with one or more upper layers in a highly reliable manner even for unlanded vias using Physical Vapor Deposition (step 101). This step may include any corresponding acts for accomplishing this result. However, in the illustrated embodiment of FIG. 1, the step 101 includes corresponding acts 103, 104, 105, 106 and 107.

Figure 3:
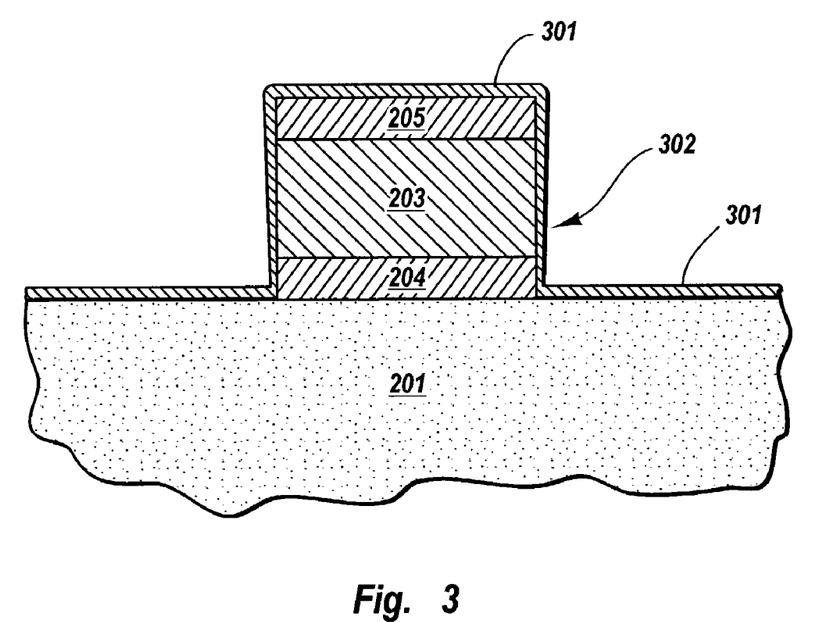
FIG. 3 illustrates a cross-section of the multiple-layered interconnect device of FIG. 2 after a single barrier metal is deposited on at least a portion of the sidewall of the metal interconnect component.

Specifically, a single barrier metal is deposited on at least a portion of the metal interconnect component including at least a portion of a sidewall of the metal interconnect component using a Physical Vapor Deposition (PVD) process (act 103). FIG. 3 illustrates a cross-section of the multiple-layered interconnect device of FIG. 2 after a single barrier metal 301 is deposited on at least a portion of the sidewall of the metal interconnect component. The PVD process may be sputtering. The barrier metal may be any suitable metal that is less reactive to the carrier gasses than the bulk of the material of the metal interconnect component. For example, Titanium Nitride is a suitable barrier metal for Aluminum when filling the via with Tungsten, since Titanium Nitride is less reactive to the carrier gas (Tungsten Hexafluoride) used to deposit the Tungsten. Other suitable barrier metals include, for example, Titanium, Tantalum, Tantalum Nitride, and alloys of Titanium Nitride, Titanium, Tantalum, and Tantalum Nitride.

PVD processes usually result in much less uniformity than CVD processes. Accordingly, the barrier metal layer 302 might tend to taper off, or even be absent, at some portions of the metal component interconnect. For example, portion 302 of barrier metal tends to taper off somewhat. However, most often, the sidewall portions that are most proximate the top surface of the metal interconnect component tend to have better coverage. The tapering thus has little consequence since the upper portions of the sidewall are the most likely portions to be exposed after via etch. In one embodiment, the barrier metal is formed having a maximum thickness in the range of from 100 to 1000 Angstroms.

The barrier metal is ideally also anisotropically etched (act 104) so that vertical etching occurs faster than horizontal etching. Methods for anisotropically etching metals such as Titanium Nitride are well known in the art. If, however, the barrier metal 301 and the Titanium Nitride anti-reflective coating 205 are both subject to anisotropic etching using the same etchant, care should be taken so that a portion of the Titanium Nitride 205 anti-reflective coating remains to thereby act as a barrier metal for the top surface of the metal interconnect component while filling the via.

Figure 4:
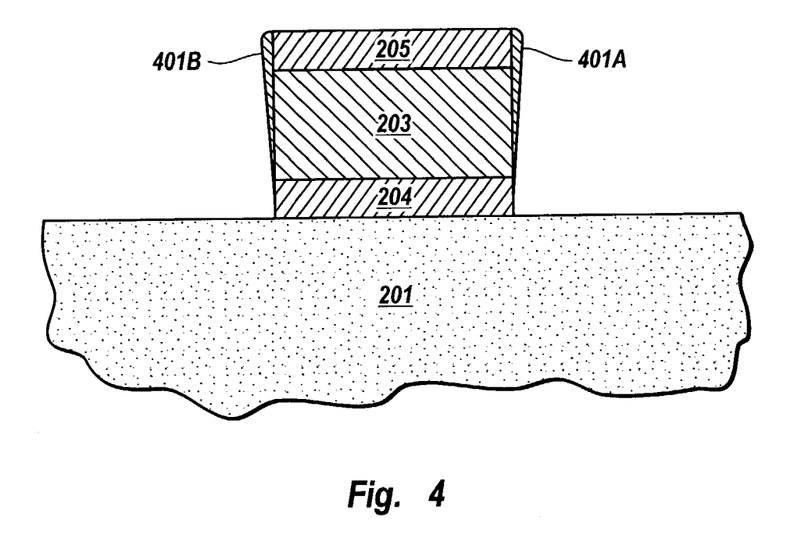
FIG. 4 illustrates a cross-section of the multiple-layered interconnect device of FIG. 3 after the barrier metal has been anisotropically etched.

FIG. 4 illustrates a cross-section of the multiple-layered interconnect device of FIG. 3 after the barrier metal has been anisotropically etched. Note that at least some of Titanium Nitride anti-reflective coating 205 still remains. However, the portion of barrier metal 301 that were on horizontal surfaces has been removed, leaving only sidewall barrier metal portions 401A and 401B. Even in anisotropic etching, there may still be some lesser level of etching on the vertical surfaces. In this example, the lower level of etching has caused some of the barrier metal to be removed completely near the bottom of the metal interconnect, although the principles of the present invention still operate (and indeed may operate even better) if none of the sidewall is exposed. The absence of the sidewall barrier metal near the bottom of the barrier sidewall is illustrated in order to demonstrate the viability of the sidewall protection even if some of the sidewall is exposed at this stage.

Figure 5:
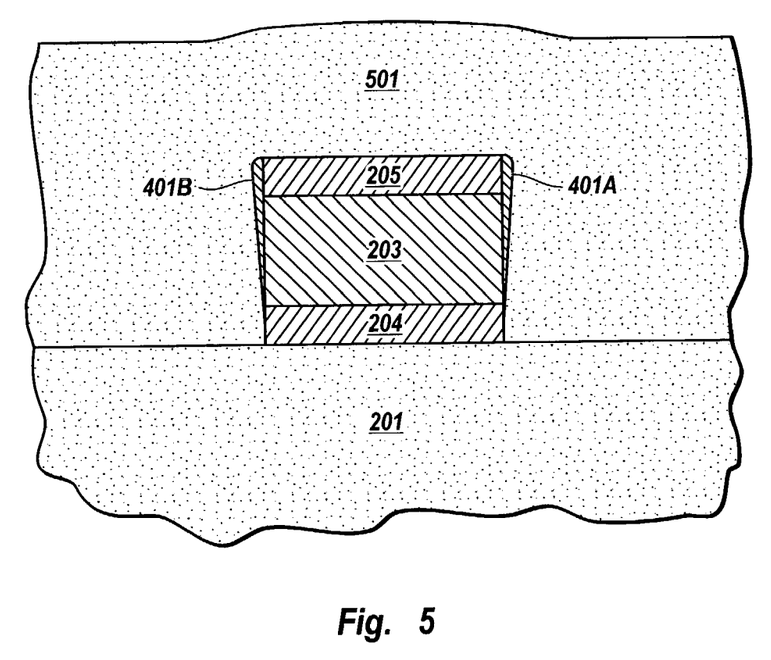
FIG. 5 illustrates a cross-section of the multiple-layered interconnect device of FIG. 4 after a dielectric layer has been formed over the metal interconnect component.

After anisotropically etching the barrier metal, a dielectric layer of, for example, Silicon Dioxide is formed over the metal interconnect component and the barrier metal (act 105). FIG. 5 illustrates a cross-section of the multiple-layered interconnect device of FIG. 4 after a dielectric layer 501 has been formed over the metal interconnect component.

Figure 6:
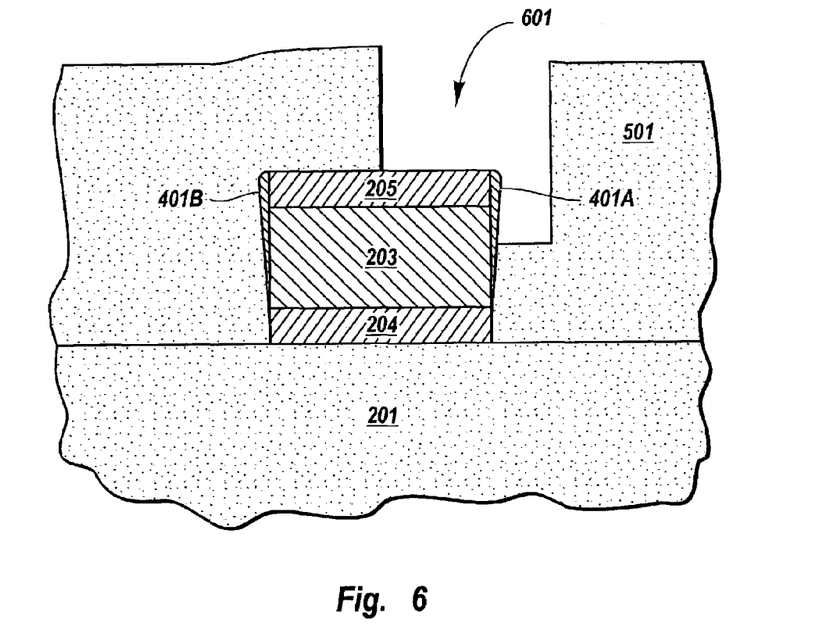
FIG. 6 illustrates a cross-section of the multiple-layered interconnect device of FIG. 5 after an unlanded via has been formed in the dielectric layer.

An unlanded via is then etched through the dielectric layer to the metal interconnect component so that the barrier metal that covers at least a portion of the sidewall of the metal interconnect component is exposed (act 106). FIG. 6 illustrates a cross-section of the multiple-layered interconnect device of FIG. 5 after an unlanded via has been formed in the dielectric layer. Note how that even though the lower portion of the metal interconnect component is not covered by the barrier metal, that the upper portion of the metal interconnect component that is exposed does sufficiently cover the patterned Aluminum layer 203.

Figure 7:
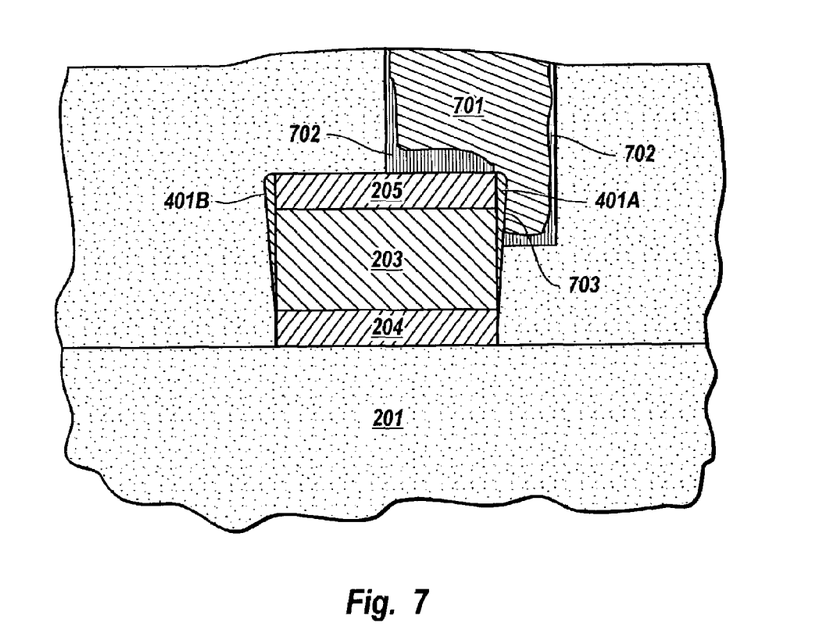
FIG. 7 illustrates a cross-section of the multiple-layered interconnect device of FIG. 6 after the unlanded via has been filled.

The unlanded via is then filled (act 107) with a second metal such as, for example, Tungsten or an alloy of Tungsten to thereby allow the metal interconnect component to electrically connect with one or more upper metal layers. Many metals such as Tungsten and alloys thereof have problems properly adhering to Silicon Dioxide directly. In order to improve adhesion, a separate Titanium Nitride deposition using CVD or PVD may be performed to add an adhesive layer of Titanium Nitride to the side walls of the unlanded via. FIG. 7 illustrates a cross-section of the multiple-layered interconnect device of FIG. 6 after the unlanded via has been filled with metal 701. Note the presence of the second Titanium Nitride layer 702. This second Titanium Nitride layer has the appearance of being deposited using the less expensive PVD process as the thickness of the layer varies and indeed in one portion labeled at surface 703, is non-existent.

As can be seen from FIG. 6, since the Aluminum is substantially protected both on the top and on all or most of the exposed sidewall, the aluminum does not react with the Tungsten Hexafluoride (WF$_6$) carrier gas. This protection occurs despite the fact that the adhesion Titanium Nitride layer 702 has a discontinuity at the sidewall of the lower metal interconnect component. Accordingly, the bond between the plug that fills the via and the metal interconnect component is more reliable despite there being no Chemical Vapor Deposition (CVD) processes involved with implementing the sidewall protection, and despite there being one barrier metal protecting the sidewall of the metal interconnect component. Accordingly, the cost associated with protecting the sidewall is reduced.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A method for fabricating a multiple-layered semiconductor interconnect device in which one metal layer is connected to another metal layer using one or more vias having metal interconnect sidewall protection against unlanded vias, the protection provided using a single barrier metal or compound without requiring Chemical Vapor Deposition (CVD) processes, the method comprising the following:

an act of forming a metal interconnect component;
   an act of depositing a single barrier metal or compound directly on at least a portion of the metal interconnect component including at least a portion of a sidewall of the metal interconnect component using a Physical Vapor Deposition (PVD) process;
   an act of forming a dielectric layer over the metal interconnect component and the single barrier metal or compound layer such that the dielectric layer is in direct contact with the single barrier metal or compound;
   an act of etching an unlanded via through the dielectric layer to the metal interconnect component so that the single barrier metal or compound that covers at least a portion of the sidewall of the metal interconnect component is exposed at the sidewall of the metal interconnect component; and
   an act of filling the unlanded via with a second metal to thereby allow the metal interconnect component to electrically connect with one or more upper metal layers.

2. A method in accordance with claim 1, further comprising the following after the act of etching and before the act of filling:

an act of depositing a barrier metal on sidewalls of the unlanded via using a PVD process.

3. A method in accordance with claim 1, further comprising the following before the act of forming a dielectric layer:

an act of anisotropically etching the single barrier metal or compound.

4. A method in accordance with claim 1, wherein the act of forming a metal interconnect component composed of a first metal comprises the following:

an act of forming the metal interconnect component at least partially out of Aluminum.

5. A method in accordance with claim 1, wherein the single barrier metal or compound is a material selected from the group consisting of Titanium Nitride, Titanium, Tantalum, Tantalum Nitride, and alloys of Titanium Nitride, Titanium, Tantalum, and Tantalum Nitride.

6. A method in accordance with claim 5, wherein the act of filling the unlanded via with a second metal to thereby allow the metal interconnect component to electrically connect with one or more upper metal layers comprises the following:

an act of filling the unlanded via with Tungsten or any alloy of Tungsten.

7. A method in accordance with claim 1, wherein the act of filling the unlanded via with a second metal to thereby allow the metal interconnect component to electrically connect with one or more upper metal layers comprises the following:

an act of filling the unlanded via with Tungsten or any alloy of Tungsten.

8. A method in accordance with claim 1, wherein the act of forming a metal interconnect component composed of a first metal comprises the following:

an act of forming the metal interconnect component out of Copper.

9. A method in accordance with claim 1, wherein the act of depositing a single barrier metal or compound directly on at least a portion of the metal interconnect component including at least a portion of a sidewall of the metal interconnect component using a Physical Vapor Deposition (PVD) process comprises the following:

an act of sputtering the single barrier metal or compound on the at least a portion of the metal interconnect component.

10. A method in accordance with claim 1, wherein the act of depositing a single barrier metal or compound directly on at least a portion of the metal interconnect component including at least a portion of a sidewall of the metal interconnect component using a Physical Vapor Deposition (PVD) process comprises the following:

an act of depositing the single barrier metal or compound to a maximum thickness of between one hundred and one thousand Angstroms.

11. A method in accordance with claim 1, wherein the act of forming a metal interconnect component composed of a first metal comprises the following:

an act of forming a Titanium Nitride bottom layer;
   an act of forming an Aluminum metal layer on the Titanium Nitride bottom layer;
   an act of forming a Titanium Nitride anti-reflective coating on the Aluminum metal layer; and
   an act of patterning the Titanium Nitride bottom layer, the Aluminum metal layer, and the Titanium Nitride anti-reflective coating.

12. A method for fabricating a multiple-layered semiconductor interconnect device in which one metal layer is connected to another metal layer using one or more vias having metal interconnect sidewall protection against unlanded vias, the protection provided using a single barrier metal or compound without requiring Chemical Vapor Deposition (CVD) processes, the method comprising the following:

an act of forming a metal interconnect component composed of Aluminum
   an act of depositing a single barrier metal or compound directly on at least a portion of the metal interconnect component including at least a portion of a sidewall of the metal interconnect component using a Physical Vapor Deposition (PVD) process, the single barrier metal or compound being a material selected from the group consisting of Titanium Nitride, Titanium, Tantalum, Tantalum Nitride, and alloys of Titanium Nitride, Titanium, Tantalum, and Tantalum Nitride;

an act of anisotropically etching the single barrier metal or compound;

after anisotropically etching the single barrier metal or compound, an act of forming a dielectric layer over the metal interconnect component and the single barrier metal or compound;

an act of forming a dielectric layer over the metal interconnect component and the single barrier metal layer or compound such that the dielectric layer is in direct contact with the single barrier metal or compound;

an act of etching an unlanded via through the dielectric layer to the metal interconnect component so that the single barrier metal or compound that covers at least a portion of the sidewall of the metal interconnect component is exposed at the sidewall of the metal interconnect component; and an act of filling the unlanded via with Tungsten or an alloy of Tungsten to thereby allow the metal interconnect component to electrically connect with one or more upper metal layers.

13. A method in accordance with claim 12, wherein the act of depositing a single barrier metal or compound directly on at least a portion of the metal interconnect component including at least a portion of a sidewall of the metal interconnect component using a Physical Vapor Deposition (PVD) process comprises the following:

an act of sputtering the single barrier metal or compound on the at least a portion of the metal interconnect component.

14. A method in accordance with claim 12, wherein the act of depositing a single barrier metal or compound directly on at least a portion of the metal interconnect component including at least a portion of a sidewall of the metal interconnect component using a Physical Vapor Deposition (PVD) process comprises the following:

an act of depositing the single barrier metal or compound to a maximum thickness of between one hundred and one thousand Angstroms.

15. A method in accordance with claim 12, wherein the act of forming a metal interconnect component composed of a first metal comprises the following:

an act of forming a Titanium Nitride bottom layer;

an act of forming an Aluminum metal layer on the Titanium Nitride bottom layer;

an act of forming a Titanium Nitride anti-reflective coating on the Aluminum metal layer; and an act of patterning the Titanium Nitride bottom layer, the Aluminum metal layer, and the Titanium Nitride anti-reflective coating.

* * * * *

UNITED STATES PATENT AND TRADEMARK OFFICE
CERTIFICATE OF CORRECTION

PATENT NO. : 6,960,529 B1  Page 1 of 1
DATED : November 1, 2005
INVENTOR(S) : Mark M. Nelson et al.

It is certified that error appears in the above-identified patent and that said Letters Patent is hereby corrected as shown below:

Title page,
Item [56], References Cited, OTHER PUBLICATIONS,
"Wolf et al…," reference, change "Prress" to -- Press --.

Column 2,
Line 18, change "process" to -- processes --.

Column 4,
Line 46, change "portions" to -- a portion --.

Column 6,
Line 11, change "205 anti-reflective coating" to -- anti-reflective coating 205 --.
Line 18, change "were" to -- was --.

Signed and Sealed this

Ninth Day of May, 2006

JON W. DUDAS
*Director of the United States Patent and Trademark Office*